(12) United States Patent
Sato et al.

(10) Patent No.: US 6,606,443 B2
(45) Date of Patent: Aug. 12, 2003

(54) OPTICAL TRANSMISSION DEVICE

(75) Inventors: Hiroshi Sato, Kokubunji (JP); Masahiro Aoki, Kokubunji (JP); Tsurugi Sudoh, Kokubunji (JP); Akira Taike, Kokubunji (JP); Tomonobu Tsuchiya, Hachioji (JP); Masaaki Komori, Kokubunji (JP); Kazuhisa Uomi, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/231,260

(22) Filed: Aug. 30, 2002

(65) Prior Publication Data

US 2003/0007765 A1 Jan. 9, 2003

Related U.S. Application Data

(63) Continuation of application No. 09/259,332, filed on Mar. 1, 1999, now Pat. No. 6,459,840.

(30) Foreign Application Priority Data

Aug. 21, 1998 (JP) .............................. 10-235246

(51) Int. Cl.⁷ .............................. G02B 6/10; G02B 6/12
(52) U.S. Cl. .................... 385/129; 385/14; 385/130; 385/131; 372/50
(58) Field of Search ..................... 385/129, 14, 130, 385/131, 28, 4; 372/50, 43, 45, 46, 64, 75, 84, 101, 102

(56) References Cited

U.S. PATENT DOCUMENTS

| 5,657,339 A | 8/1997 | Fukunaga |
| 5,960,023 A | 9/1999 | Takahashi |
| 5,987,046 A | 11/1999 | Kobayashi et al. |
| 6,018,541 A | 1/2000 | Huang |
| 6,151,351 A | 11/2000 | Kito et al. |

FOREIGN PATENT DOCUMENTS

JP 9-171113 6/1997

OTHER PUBLICATIONS

Preliminary Transactions for the 58th Conference of the Japan Society of Applied Physics, 3p–ZC–6, 3p ZC–6.
IEEE Journal of Quantum Electronics, vol. 27, No. 6, Jun. 1991, pp. 1732–1735.

*Primary Examiner*—Frank G. Font
*Assistant Examiner*—Layla Lauchman
(74) *Attorney, Agent, or Firm*—Mattingly, Stanger & Malur, P.C.

(57) ABSTRACT

An optical transmission device particularly adapted to a high-speed and large-capacity optical transmission system with a large optical output and excellent reflection resistance includes a waveguide-type optical element for emerging light and an optical transmission path that is to be optically coupled to the waveguide-type optical element. The waveguide-type optical element includes, at least in part thereof, a light-emitting portion having a gain-coupled diffraction grating and a mode-converting region integrated with the light-emitting portion.

5 Claims, 4 Drawing Sheets

OPTICAL TRANSMISSION DEVICE

This is a continuation application of U.S. Ser. No. 09/259,332, filed Mar. 1, 1999, now U.S. Pat. No. 6,459,840.

BACKGROUND OF THE INVENTION

The present invention relates to an optical transmission device or an optical communication module whose optical components have satisfactory optical coupling characteristics. The present invention can also provide optical transmission components whose optical components have satisfactory optical coupling efficiency. The present invention is well adapted to optical communication systems and optical communication networks.

To implement satisfactory transmission characteristics in an optical communication system, an optical transmission device must have a high output capability, and this requires highly efficient optical coupling between a light source, e.g., a semiconductor laser diode (LD) and a dielectric waveguide or optical fiber during the process of mounting the optical transmission device. However, there is a wide discrepancy between the beam-emerging angle of a conventional semiconductor laser device and the light-receiving angle of an optical fiber or optical waveguide, and thus the optical coupling efficiency obtained through their direct coupling is not satisfactory.

To overcome this problem, a conventional optical module for communications must use an optical lens for compensating the discrepancy and further adjust the optical axes of its laser, lens and optical fiber highly accurately during the mounting process. On the other hand, for economized utilization of optical communications, a reduction in the size, power dissipation and cost of an optical transmission device has recently been called for. Therefore, economization and mass-production of various components, especially, an optical module incorporated in an optical transmission device are essential in achieving an inexpensive optical communication system.

For these needs, to improve coupling efficiency in direct coupling and to relax alignment tolerance of optical axis, attempts have been made positively to add a lens function to a semiconductor laser device by integrating a propagating mode converter or a guided mode converter with the semiconductor laser device.

The mode converter means a component for narrowing a beam divergence of a semiconductor laser device that has wide angles of divergence ranging from, e.g., 30 to 40 degrees. The mode converter improves the optical coupling efficiency between a semiconductor laser device and an optical transmission path such as an optical fiber.

The integration of mode converters has been implemented mainly with Fabry-Perot semiconductor laser devices. However, to increase the transmission speed and capacity of an optical communication system, integration of a mode converter with a distributed feedback (DFB) semiconductor laser device is requisite. Thus, integration of a mode expanding device with a DFB semiconductor laser device has been started, some examples of which are reported in the Preliminary Transactions 3p-ZC-5, 3p-ZC-6, etc of Preliminary Transactions for the 58th Conference of the Japan Society of Applied Physics.

SUMMARY OF THE INVENTION

However, when a mode converter is integrated with a DFB semiconductor laser device as described above and thus their optical coupling efficiency is improved, the following inconvenience occurs. That is, when the coupling efficiency is improved, the light that has reflected at the incident end face of an optical transmission path, the repeating points along the optical transmission path and the like returns to the DFB semiconductor laser device easily. The returning reflected light causes noise and the like within the semiconductor laser device, thus becoming a main source of deteriorating the transmission characteristics of an optical module, an optical transmission device, and hence of a communication system. Therefore, to make the most of the excellent feature of mode converter integration, it is technically critical to establish satisfactory resistance to reflected light.

An object of the present invention is to provide an optical transmission device that can improve its resistance to returning reflected light by improving the resistance to returning reflected light of a semiconductor laser device, which is a light source, while maintaining optical coupling between the light source and an optical transmission path highly efficiently.

One aspect of the present invention provides an optical transmission member or an optical transmission device having features not disclosed in the aforementioned prior art (reported in the Preliminary Transactions 3p-ZC-5, 3p-ZC-6, etc of the 58th Conference of the Japan Society of Applied Physics), so that high optical coupling efficiency characteristics of a mode converter-integrated laser is maximized. That is, the optical transmission member or the optical transmission device provided by the invention has novel features such that a mode converter having an optical waveguide with a modulated thickness and a gain-coupled (GC) DFB semiconductor laser device are integrally formed.

The inventors paid attention to the fact that a GC DFB semiconductor laser device exhibits better resistance to returning reflected light than an ordinary DFB semiconductor laser device. The effect of laser oscillation by gain guiding to reduce returning light noise has already been verified in a self-oscillating semiconductor laser element using a Fabry-Perot resonator. In the Fabry-Perot resonator, regions having different gains arranged in a stripe pattern in the direction of the resonator exerts considerable influences on multimode laser oscillation, and these regions cancel out the returning light noise. In a semiconductor laser element used for optical transmission, self oscillation is what has to be avoided, because self oscillation, i.e., the phenomenon in which the intensity of laser oscillation fluctuates in small pulsations only by applying current independently of an input signal from outside the element, is harmful to the transmission accuracy of an optical signal. On the other hand, in a DFB semiconductor laser device in which the present invention is embodied, the regions having different gains have been utilized to concentrate large quantities of current at a predetermined location in a light-emitting region where a diffraction grating is additionally provided. Laser oscillation conditions in a resonator of this type depend greatly on the pattern of a diffraction grating that is formed along the light-emitting region.

However, according to the knowledge empirically obtained by the inventors, even if the regions having different gains are provided in a stripelike form in such a DFB semiconductor laser device, it has been found out that noise attributable to an optical beam accidentally injected from an optical fiber can be reduced. Even if a mode converter is provided between the laser oscillating region and the optical fiber, the effect is such that the aforementioned noise is almost negligible. That is, when a mode converter analogous to a beam spot expander disclosed in JP-A-9-171113 is interposed between a laser oscillating region having a DFB resonator structure and an optical fiber, a laser beam generated at the laser oscillating region can be introduced into the optical fiber efficiently. However, the aforementioned returning light injected from the optical fiber is also transmitted to the laser oscillating region efficiently. Therefore, a DFB semiconductor laser device having the beam spot expanding region recited in JP-A-9-171113 can improve the transmission efficiency of an optical signal, but may have to provide some measures to prevent the noise. Another object of the present invention is to overcome such problem over the trade-off encountered in the conventional integrated optical element.

Another aspect of the present invention provides a mode converter-integrated DFB semiconductor laser device having an excellent resistance to returning reflected light and capable of highly efficient optical coupling to an optical transmission path and thereby provides an optical transmission device having an excellent resistance to returning reflected light with high optical output. When such an optical transmission device is used, an optical transmission system having an excellent resistance to returning reflected light can be provided while maintaining optical coupling between a light-emitting portion and an optical transmission path highly efficiently. In an optical transmission device that is a specific embodiment of the present invention, a mode converter-integrated DFB semiconductor laser device is optically coupled to an optical fiber directly (without interposing any optical element therebetween).

Some features of the waveguide-type optical element, optical module, and optical transmission device of the present invention may be as follows.

First, a waveguide-type optical element includes an optical waveguide layer having a refractive index suitable for light propagation and a structure over a semiconductor substrate. The structure is sandwiched by clad layers made of a material having a wider band gap and a lower refractive index than a material of the optical waveguide layer. The optical waveguide layer has, at least in part thereof, a light-emitting region and a mode-converting region optically coupled to the light-emitting region. The light-emitting region has, at least in part thereof, a diffraction grating whose refractive index cyclically changes in a direction of travel of the light. In a region where the diffraction grating is provided, gains or losses of the light change cyclically.

It is preferable that the mode-converting region be formed so that the thickness of the optical waveguide layer continuously decreases in the direction of travel of the light. It is also preferable that the mode-converting region be formed so that the thickness of the optical waveguide layer continuously decreases in the direction of travel of the light and that the width of the optical waveguide layer transverse to the direction of travel of the light changes toward a light emerging portion.

On the other hand, it is preferable that the optical waveguide portion be of a ridge-waveguide type and that the width of the optical waveguide transverse to the direction of travel of the light be modulated in a direction of propagation of the light.

Next, an optical module has a waveguide-type optical element for emerging light and an optical transmission path that is to be optically coupled to the waveguide-type optical device. The waveguide-type optical device has an optical waveguide layer having a refractive index preferred for propagating the light. The optical waveguide layer has, at least in part thereof, a light-emitting region and a mode-converting region optically coupled to the light-emitting region. The light-emitting region has, at least in part thereof, a diffraction grating whose refractive index cyclically changes in a direction of travel of the light. In a region where the diffraction grating is provided, gains and losses of the light change cyclically.

Further, it is preferred in the optical module that an end face of the waveguide-type optical element from which the light emerges confront an end face of the optical transmission path on which the light is incident. It is also preferred that the thickness of the optical waveguide layer continuously decrease in the direction of travel of the light in the mode-converting region of the waveguide-type optical element. It is further preferred that the optical waveguide portion be of a ridge-waveguide type.

An optical transmission device has an optical module for generating an optical signal. The optical module has, at least in part thereof, a waveguide-type optical element for emerging light and an optical transmission path that is to be optically coupled to the waveguide-type optical element. The waveguide-type optical element includes an optical waveguide layer having a refractive index preferred for propagating the light. The optical waveguide layer has, at least in part thereof, a light-emitting region and a mode-converting region optically coupled to the light-emitting region. The light-emitting region has, at least in part thereof, a diffraction grating whose refractive index cyclically changes in the direction of travel of the light. In a region where the diffraction grating is provided, gains or losses of the light change cyclically.

It is preferable in the optical transmission device that an end face of the waveguide-type optical element from which the light emerges confront an end face of the optical transmission path on which the light is incident. Further, it is preferable that the thickness of a laminated body constituting the optical waveguide continuously decrease in a direction of emergence of the light in the mode-converting region of the waveguide-type optical element. It is preferable that the thickness of the optical waveguide which continuously decreases in the direction of emergence of the light do not exceed, at a light-emerging end face, ⅓ of the thickness of the optical waveguide in a light-emitting portion. Further, it is preferable in the optical transmission device that the width of its waveguide portion in a direction perpendicular to the optical axis be modulated toward a portion from which the light emerges. It is also preferable that the optical waveguide portion be of a ridge-waveguide type.

The GC DFB semiconductor laser having a resonance structure suitable for embodying the present invention means a semiconductor laser device which has a diffraction grating whose refractive index cyclically changes in the direction of travel of light of the semiconductor laser device and in which gains or losses of the light cyclically change in a region where the diffraction grating is provided. Reflection resistance of a conventional GC DFB semiconductor laser device is discussed in detail in such literature as IEEE Journal of Quantum Electronics, Vol. 27, No. 6, pp. 1732–1735.

BRIEF DESCRIPTION OF THE DRAWINGS

FIG. 1b is an end elevation as viewed in a direction indicated by the arrow A of FIG. 1a;

FIG. 3b is an end elevation as viewed in a direction indicated by the arrow A of FIG. 3a.

DETAILED DESCRIPTION OF THE INVENTION

Preferred embodiments of the present invention will now be described with reference to the accompanying drawings.

Embodiment 1

Figure 1A:
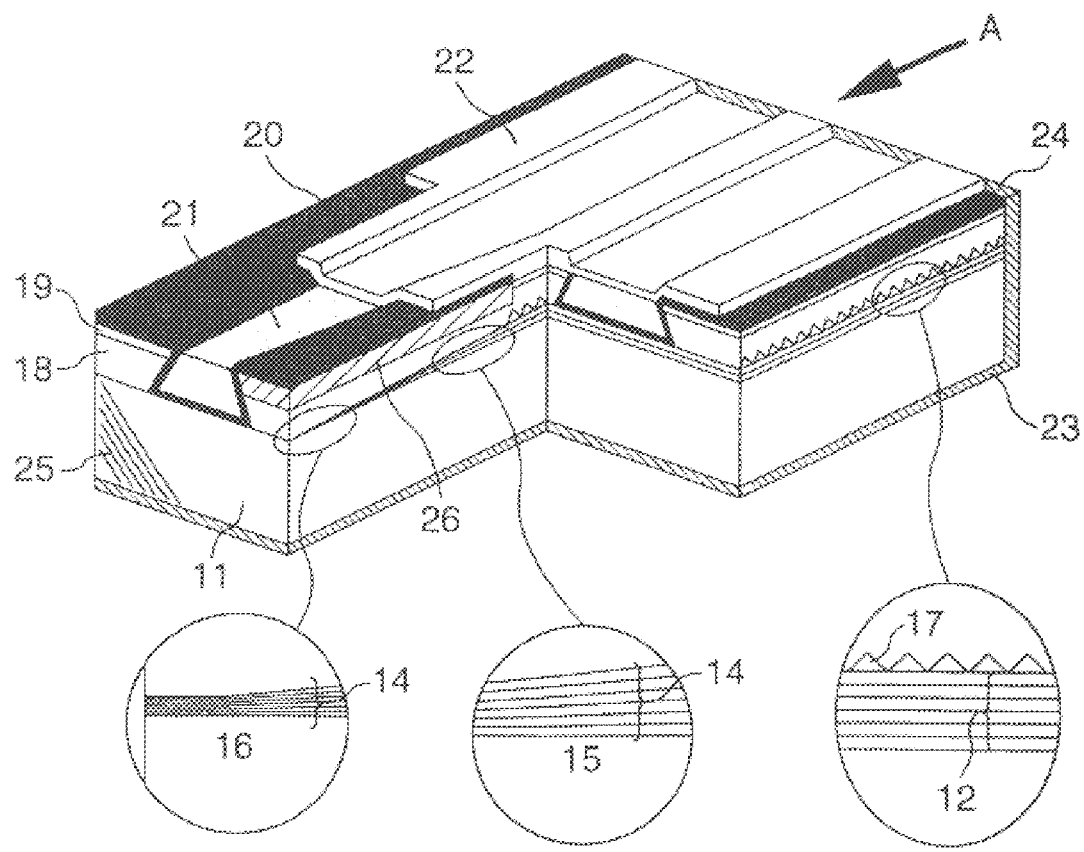
FIG. 1a is a perspective view of a ridge-waveguide type laser device including an optical transmission device, which is an embodiment of the present invention.
Figure 1B:
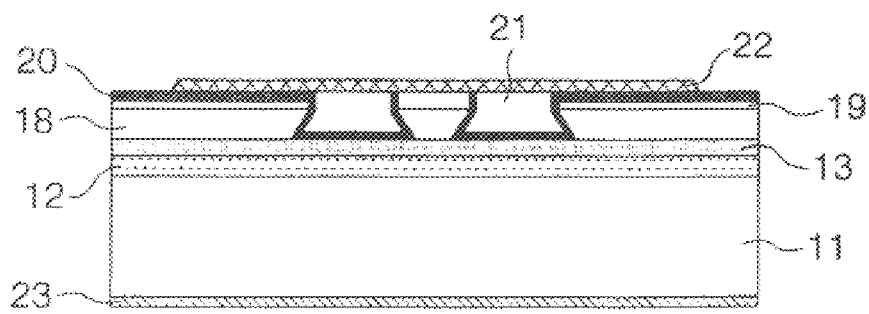

A ridge-waveguide laser device for a wavelength of a 1.3 $\mu$m band, according to an embodiment of the present invention, will be described using FIGS. 1a and 1b.

First, after putting an Si shadow mask over an n-type (100) InP semiconductor substrate 11 by a known technique, a laminated body 12, an n-InGaAsP (whose composition wavelength or band gap wavelength is 1.05 $\mu$m) optical waveguide layer 13 being 0.05 $\mu$m thick and an InP clad layer 0.05 $\mu$m (not shown) are formed on the substrate 11 by means of a metal organic vapor phase epitaxy (MOVPE) method using a material gas such as trimethylindium, triethylgallium, arsine or phosphine. The laminated body 12 includes: an n-InP buffer layer 0.1 $\mu$m thick; an n-InGaAsP lower guide layer (whose composition wavelength or band gap wavelength is 1.05 $\mu$m) 0.05 $\mu$m thick; a multiple quantum well active layer consisting of six periods, each period having a 6.0 nm thick InGaAsP (whose composition wavelength or band gap wavelength is 1.3 $\mu$m) well layer having 1.1% compressive strain and a 12 nm thick InGaAsP (whose composition wavelength or band gap wavelength is 1.05 $\mu$m) barrier layer; and an InGaAsP (whose composition growth rate is 1.05 $\mu$m) optical waveguide layer 0.10 $\mu$m thick. The light-emitting wavelength of the multiple quantum well active layer is about 1.3 $\mu$m. As is known well, in shadow masked growth (SMG), the thickness of a grown film is reduced only below the mask. Therefore, a synthetic layer 14 consisting of the laminated body 12, the optical waveguide layer 13 and a p-InP clad layer has both a thick region 15 and a thin region 16 continuously formed on the same wafer. While the MOVPE method is used in this embodiment, a molecular beam epitaxy (MBE) method and the like may also be used.

After the crystal growth, a diffraction grating 17 is formed at a location other than where the thickness is tapered on the n-type optical waveguide layer 13 by a known interference exposure technique and a subsequent etching process using a Br-containing solution. Successively, a p-InP clad layer 4.0 $\mu$m 18 and a p-InGaAs layer 0.2 $\mu$m 19 are formed using the MOVPE method.

After the crystal growth process, the InGaAs layer is processed into a stripe structure in which the width of the layer spreads in a beam emerging direction in a flarelike form by means of a known wet etching using a Br2-containing solution. Here, the stripe is in a [011] direction, and a ridge waveguide is formed by a known method using an etching solution containing hydrobromic acid. As a result, an InP (111) A crystal plane appears on the side walls of the ridge waveguide, and the ridge waveguide has a cross section of inverted mesa. The bottom of the ridge is 2.0 $\mu$m wide along the straight stripe, and is 8.0 $\mu$m wide at the beam emerging end face.

Successively, a 0.50 $\mu$m thick silicon oxide film 20 is formed over the entire surface of the substrate by a thermo-chemical vapor deposition (T-CVD) method. While the silicon oxide film is used as an insulating film in this embodiment, a silicon nitride film or the like can also be used. After the wafer surface is planarized using a polyimide resin 21, a silicon oxide film window is formed in the upper surface of the ridge using an etch-back method. A reactive ion etching (RIE) method is used as an etch-back process. As the last step, the resultant is cut into separate elements each having a resonator length of 600 $\mu$m including a 300 $\mu$m long film thickness tapered portion by a cutting process after electrodes 22 and 23 have been formed, and a reflecting film 24 having a reflectance of 95% is coated on the rear end face and a low reflecting film 25 having a reflectance of 0.1% is coated on the front end face. Further, a high-resistance region 26 is provided on the p-InP clad layer 18 in the mode-converting region, in order to reduce invalid current.

The thus prepared laser device exhibited satisfactory oscillation characteristics with a threshold current ranging from 10 to 12 mA and an oscillation efficiency ranging from 0.40 to 0.45 W/A at room temperature and under continuous oscillation. Further, at an operating temperature of 85° C., a threshold current of about 35 mA and an oscillation efficiency ranging from 0.28 to 0.32 W/A were obtained. The beam divergence angle at an operating output of 10 mW is about 12 degrees both in horizontal and vertical directions, with an average coupling loss to a flat-end fiber is 3 dB or less. As a result, the module achieved an optical output of 5 mW. Further, the long-term reliability of the element was evaluated at 85° C. and 10 mW, and it was confirmed that the element has an estimated life of 100,000 hours or more.

While the laser oscillation wavelength, i.e., the light-emitting wavelength of the multiple quantum well active layer is set to 1.3 $\mu$m in this embodiment, similar advantages can also be obtained when the wavelength is set to 1.5 $\mu$m.

Embodiment 2

Figure 2A:
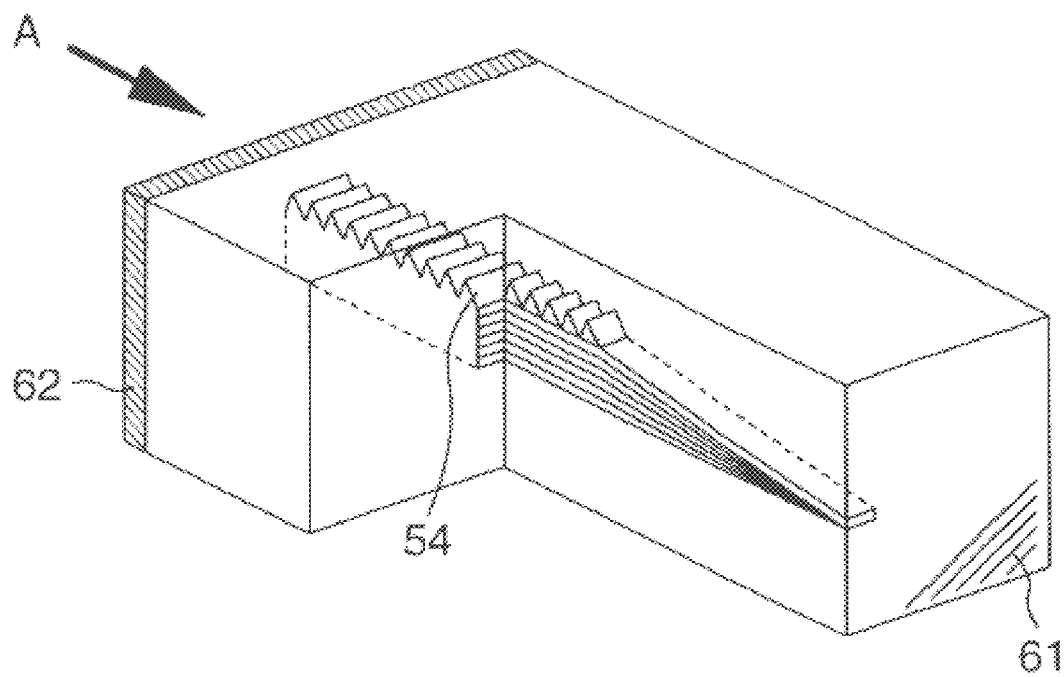
FIG. 2a is a perspective view of an embedded laser device including an optical transmission device, which is an embodiment of the present invention.
Figure 2B:
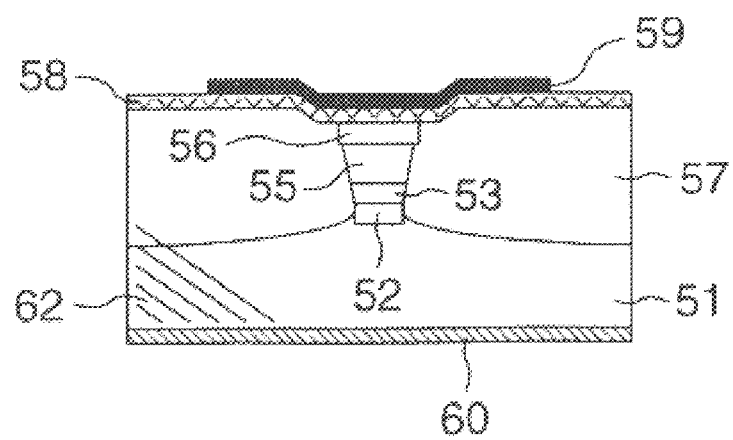
FIG. 2b is an end elevation as viewed in a direction indicated by the arrow A of FIG. 2b.

An embedded laser device for a wavelength of 1.3 $\mu$m, which is another embodiment of the present invention will be described with reference to FIGS. 2a and 2b.

Similarly to the first embodiment, after depositing an Si shadow mask over an n-type (100) InP semiconductor substrate 51, a laminated body 52, an n-InGaAsP optical waveguide layer 0.05 $\mu$m 53 and an InP clad layer 0.05 $\mu$m are formed on the substrate 51 by means of the MOVPE (Metal Organic Vapor Phase Epitaxy) using a material gas such as trimethylindium, triethylgallium, arsine or phosphine. The laminated body 52 includes: an n-InP buffer layer 0.1 $\mu$m; an n-InGaAsP lower guide layer (whose composition wavelength or band gap wavelength is 1.05 $\mu$m) 0.05 $\mu$m; a multiple quantum well active layer that consists of a 6.0 nm thick InGaAsP (whose composition wavelength or band gap wavelength is 1.3 $\mu$m) well layer having 1.1% compressive strain and a 12 nm thick InGaAsP (whose composition wavelength or band gap wavelength is 1.05 $\mu$m) barrier layer and that has six cycles; and an InGaAsP (whose composition growth rate is 1.05 $\mu$m) optical waveguide layer 0.10 $\mu$m. The light-emitting wavelength of the multiple quantum well active layer is about 1.3 μm similarly to the first embodiment.

After the crystal growth process, a diffraction grating 54 is formed similarly to the first embodiment. Then, a p-InP clad layer 4.0 μm 55 and a p-InGaAs layer 0.2 μm 56 are formed using the MOVPE method.

After the crystal growth process, a mesa stripe is formed by wet etching using a bromine methanol solution using a 8.5 μm wide stripe made of a silicon oxide film as a mask. Then, the mesa stripe is embedded by an Fe-added high resistance InP 57. The mesa stripe can also be formed by dry etching. While the Fe-doped InP is used as a semi-insulating embedded layer, Ti or the like may be used as an impurity to be added.

Successively, a 0.50 μm thick silicon oxide film 58 is formed over the entire surface of the substrate by the T-CVD method, and the silicon oxide film is removed only from the upper portion of the mesa stripe. As the last step, the resultant is cut into separate elements, each having a resonator length of 600 μm including a 300 μm long film thickness tapered portion, by a cutting process after electrodes 59 and 60 have been formed, and a reflecting film 61 having a reflectivity of 95% is coated on the rear end face and a low reflectivity film 62 having a reflectance of 0.1% is coated on the front end face similarly to the first embodiment.

The prepared element exhibited a threshold current ranging from 5 to 8 mA and an oscillation efficiency ranging from 0.40 to 0.42 W/A at room temperature under continuous oscillation. Further, the element exhibited a threshold current of about 30 mA and a maximum output of 20 mW or more at an operating temperature of 85° C. The beam spreading angle at an operating output of 10 mW ranges from 8 to 10 degrees both in horizontal and vertical directions, with an average coupling loss to a flat-end fiber is 3 dB or less. As a result, a maximum module output of 5 mW or more was achieved. Further, the long-term reliability of the element was evaluated at 85° C. and 10 mW, and it was confirmed that the element has an estimated life of 100,000 hours or more.

Embodiment 3

An optical transmission device, which is another embodiment of the present invention, will be described with reference to FIGS. 3a and 3b and FIG. 4. More specifically, exemplary configurations of an optical module and an optical network unit will be described.

Figure 3A:
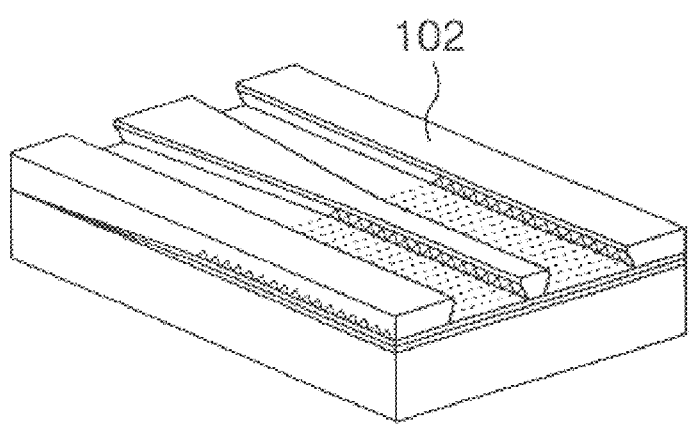
FIG. 3a is a perspective view of an optical module, which is an embodiment of the present invention, the optical module having an optical transmission device applied thereto.
Figure 3B:
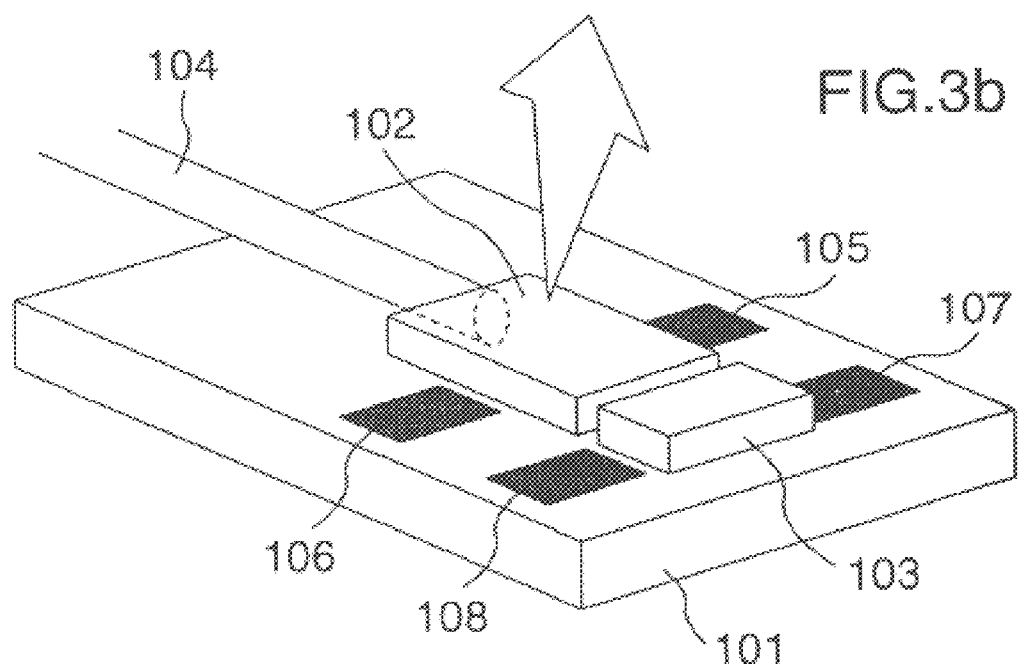

FIGS. 3a and 3b show an exemplary optical module. A semiconductor laser device 102 is mounted on a mounting board 101 so as to be aligned with the optical axis of an optical fiber 104. Here, the shape of the incident end face of the optical fiber may be either planar or spherical. The optical fiber 104 is usually fixed in a V-shaped groove provided in the mounting board 101. In this embodiment, the mode converter-integrated GC DFB semiconductor laser device shown in the first embodiment is used as the semiconductor laser device. The length of the element and the reflectances at the end faces are the same as those described with reference to the first embodiment. Even if a semiconductor laser device to be mounted is of the embedded structure shown with reference to the second embodiment, the basic mode is exactly the same as the mode shown in FIG. 3.

The semiconductor laser device 102 has a p-type electrode mounted so that the electrode faces the mounting board and a light-receiving element 103 for monitoring optical output mounted behind itself. It should be noted that electrode pads for components to be mounted on the mounting board 101 are denoted by reference numerals 105 to 108 in FIG. 3b. Since ordinary wiring is employed to connect these components to the pads, their detailed description is omitted.

The coupling loss to the optical fiber 104 fixed onto the mounting board was about 3 dB. The long-term reliability of the optical transmission device was evaluated at 85° C. and at a constant optical output of 2 mW, and it was confirmed that the device has an estimated life of 100,000 hours or more.

Figure 4:
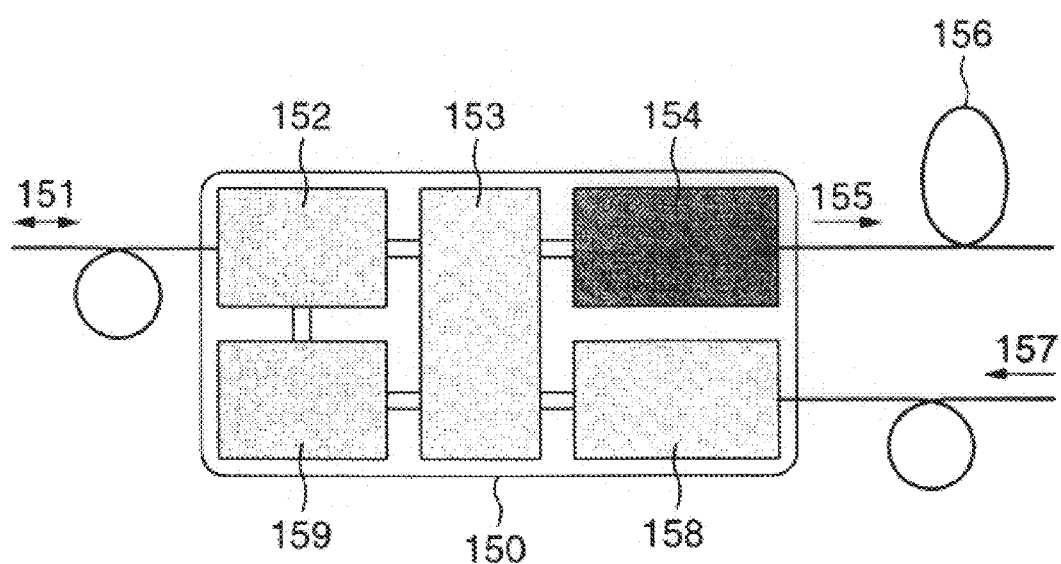
FIG. 4 is a diagram schematically showing the construction of an optical communication unit, which is an embodiment of the present invention.

FIG. 4 is a schematic diagram showing the configuration of a specific example in which the aforementioned optical module is applied to an optical communication unit 150. For example, signals applied from various types of terminal devices are supplied to a signal multiplexer 153 via an external connection path 151 and an interface 152, and a predetermined signal is then supplied to an optical module 114. An optical signal 155 generated by the optical module 154 is transmitted via an optical fiber 156. The semiconductor laser device described with reference to the first and second embodiments is included in the optical module 154. Further, an optical signal receiver 158, a driving power supply 159 and the like are included in the optical communication unit. As a result of such configuration, an input signal 157 received by the transmission device can be transferred to an external medium through the connection path 151. Since the basic configurations of these components are similar to those of known examples, their detailed description is omitted.

The aforementioned embodiments can provide an optical transmission system having a satisfactory resistance to returning light while maintaining the optical coupling between a light-emitting section and an optical transmission path at a high efficiency.

The optical transmission members according to the aforementioned embodiments can provide an optical transmission device adapted to a high-speed and large-capacity optical transmission system exhibiting such highly efficient optical coupling and satisfactory reflection resistance.

What is claimed is:

1. An optical module comprising a waveguide-type optical device for radiating light and an optical transmission path optically coupled to the waveguide-type optical device, the waveguide-type optical device having an optical waveguide layer structure, the optical waveguide layer structure having, at least in a part thereof, a light-emitting region and a mode-converting region optically coupled to the light-emitting region for narrowing a beam of light, emitted by the light-emitting region, for radiation to an external of the device, the light-emitting region including, at least in a part thereof, a diffraction grating made of a composition material having a band gap wavelength shorter than a wavelength of light emitted by the light-emitting region so that an increase of an optical gain of the light emitting region cyclically changes in the part where the diffraction grating is provided, a refractive index of the diffraction grating cyclically changing in a direction of travel light, the mode-converting region including a p-InP clad layer having a high-resistance region.

2. An optical module according to claim 1,
   wherein an end face of the waveguide-type optical device from which the light emerges confronts an end face of the optical transmission path on which the light is incident.

3. An optical module according to claim 1,
wherein a thickness of the optical waveguide layer structure continuously decreases in the direction of travel of the light in the mode-converting region of the waveguide-type optical device.

4. An optical module according to claim 1,
wherein the optical waveguide layer structure includes an optical waveguide portion of a ridge-waveguide type.

5. An optical transmission device having an optical module for generating an optical signal, the optical module including a waveguide-type optical device for radiating light and an optical transmission path optically coupled to the waveguide-type optical device the waveguide-type optical device having an optical waveguide layer structure, the optical waveguide layer structure having, at least in a part thereof, a light-emitting region and a mode-converting region optically coupled to the light-emitting region, the light-emitting region including, at least in a part thereof, a diffraction grating made of a composition material having a band gap wavelength shorter than a wavelength of light to be emitted by the light-emitting region so that an increase of an optical gain of the light-emitting region cyclically changes in the part where the diffraction grating is provided, a refractive index of the diffraction grating cyclically changing in a direction of travel of the light, the mode-converting region including a p-InP clad layer having a high-resistance region.

* * * * *